United States Patent
Zhang et al.

(10) Patent No.: US 8,341,569 B2
(45) Date of Patent: Dec. 25, 2012

(54) STATISTICAL ITERATIVE TIMING ANALYSIS OF CIRCUITS HAVING LATCHES AND/OR FEEDBACK LOOPS

(75) Inventors: Lizheng Zhang, Madison, WI (US); Yuhen Hu, Middleton, WI (US); Chun-ping Chen, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 194 days.

(21) Appl. No.: 12/842,268

(22) Filed: Jul. 23, 2010
(Under 37 CFR 1.47)

(65) Prior Publication Data
US 2010/0313177 A1 Dec. 9, 2010

Related U.S. Application Data

(62) Division of application No. 11/966,265, filed on Dec. 28, 2007, now Pat. No. 7,793,245.

(51) Int. Cl.
*G06F 17/50* (2006.01)
(52) U.S. Cl. ........ 716/106; 716/108; 716/111; 716/113; 716/134; 716/136
(58) Field of Classification Search ............. 716/104, 716/106, 108, 111, 113, 134, 136
See application file for complete search history.

(56) References Cited

U.S. PATENT DOCUMENTS

| | | | | |
|---|---|---|---|---|
| 6,023,568 | A * | 2/2000 | Segal | 703/2 |
| 7,526,745 | B2 * | 4/2009 | Vergara-Escobar | 716/102 |
| 7,624,364 | B2 | 11/2009 | Albrecht et al. | |
| 8,000,951 | B2 * | 8/2011 | Arayama | 703/19 |
| 2005/0268258 | A1 * | 12/2005 | Decker | 716/4 |
| 2008/0276209 | A1 | 11/2008 | Albrecht et al. | |
| 2009/0150136 | A1 * | 6/2009 | Yang | 703/13 |

FOREIGN PATENT DOCUMENTS

JP 2008097130 A * 4/2008

OTHER PUBLICATIONS

Zhang et al.; "Convergence-provable statistical timing analysis with level-sensitive latches and feedback loops"; Publication Year: 2006; Design Automation, 2006. Asia and South Pacific Conference on.*
Nazarian et al.; "Accurate Timing and Noise Analysis of Combinational and Sequential Logic Cells Using Current Source Modeling"; Publication Year: 2011; Very Large Scale Integration (VLSI) Systems, IEEE Transactions on; vol. 19, Issue: 1; pp. 92-103.*
Zhang et al., Correlation-Preserved Non-Gaussian Statistical Timing Analysis with Quadratic Timing Model, Design Automation Conference Jun. 13-17, 2005, Univ. of WI. Dept. of Electrical Eng, pp. 83-88 of conference publication.

(Continued)

*Primary Examiner* — Helen Rossoshek
(74) *Attorney, Agent, or Firm* — Craig A. Fieschko, Esq.; DeWitt Ross & Stevens S.C.

(57) ABSTRACT

Statistical timing analysis methods for circuits having latches and feedback loops are described wherein the circuit yield, and/or the critical cycle mean (the largest cycle mean among all loops in the circuit), may be iteratively calculated with high speed and accuracy, thereby allowing their ready usage in the analysis and validation of proposed circuit designs.

5 Claims, 2 Drawing Sheets

OTHER PUBLICATIONS

Zhang et al., Correlation-Preserved Statistical Timing with Quadratic Form of Gaussian Variables, IEEE Transactions on Computer-Aided Design of Integrated Circuits and Systems, vol. 25, No. 11, Nov. 2006.

StatITA: Statistical Iterative Timing Analysis for Circuits with Transparent Latches and Feedback Loops, Dissertation, Univ. of WI., Dec. 2005.

Zhang, et al., Statistical Static Timing Analysis with Conditional Linear MAX/MIN Approximation and Extended Canonical Timing Model, IEEE Transactions on Computer-Aided Design of Integrated Circuits and Systems, vol. 25, No. 6, Jun. 2006.

Zhang et al., Statistical Timing Analysis with Path Reconvergence and Spatial Correlations, Electrical and Computer Engineering, Univ. of WI 2006.

* cited by examiner

STATISTICAL ITERATIVE TIMING ANALYSIS OF CIRCUITS HAVING LATCHES AND/OR FEEDBACK LOOPS

CROSS-REFERENCE TO RELATED APPLICATIONS

This application is a divisional of U.S. patent application Ser. No. 11/966,265 filed 28 Dec. 2007, which in turn claims priority under 35 USC §119(e) to U.S. Provisional Patent Application 60/882,687 filed 29 Dec. 2006. The entireties of these prior applications are incorporated by reference herein.

STATEMENT REGARDING FEDERALLY SPONSORED RESEARCH

This invention was made with United States government support awarded by the following agencies:
National Science Foundation (NSF) Grant No(s).: 0093309
The government has certain rights in this invention.

FIELD OF THE INVENTION

This document concerns an invention relating generally to statistical timing analysis of integrated circuits having feedback loops and latches.

BACKGROUND OF THE INVENTION

For integrated circuits (e.g., VLSI chips) to work properly, the signals traveling along their gates and interconnects must be properly timed, and several factors are known to cause timing variations. As examples, variations in manufacturing process parameters (such as variations in interconnect diameter, gate quality, etc.) can cause timing parameters to deviate from their designed value. In low-power applications, lower supply voltages can cause increased susceptibility to noise and increased timing variations. Densely integrated elements and non-ideal on-chip power dissipation can cause "hot spots" on a chip, which can also cause excessive timing variations.

A classical approach to timing analysis is to analyze each signal path in a circuit and determine the worst case timing. However, this approach produces timing predictions that are often too pessimistic and grossly conservative. As a result, statistical timing analysis (STA)—which characterizes timing delays as statistical random variables—is often used to obtain more realistic timing predictions. By modeling each individual delay as a random variable, the accumulated delays over each path of the circuit will be represented by a statistical distribution. As a result, circuit designers can design and optimize chips in accordance with acceptable likelihoods rather than worst-case scenarios.

In STA, a circuit is modeled by a directed acyclic graph (DAG) known as a timing graph wherein each delay source—either a logic gate or an interconnect—is represented as a node. Each node connects to other nodes through input and output edges. Nodes and edges are referred to as delay elements. Each node has a node delay, that is, a delay incurred in the corresponding logic gates or interconnect segments. Similarly, each edge has an edge delay, a term of signal arrival time which represents the cumulative timing delays up to and including the node that feeds into the edge. Each edge delay has a path history: the set of node delays through which a signal travels before arriving at this edge. Each delay element is then modeled as a random variable, which is characterized by its probability density function (pdf) and cumulative distribution function (cdf). The purpose of STA is then to estimate the edge delay distribution at the output(s) of a circuit based on (known or assumed) internal node delay distributions.

The three primary approaches to STA are Monte Carlo simulation, path-based STA, and block-based STA. As its name implies, Monte Carlo simulation mechanically computes the statistical distribution of edge delays by analyzing all (or most) possible scenarios for the internal node delays. While this will generally yield an accurate timing distribution, it is computationally extremely time-consuming, and is therefore often impractical to use.

Path-based STA attempts to identify some subset of paths (i.e., series of nodes and edges) whose time constraints are statistically critical. Unfortunately, path-based STA has a computational complexity that grows exponentially with the circuit size, and thus it too is difficult to practically apply to many modern circuits.

Block-based STA, which has largely been developed owing to the shortcomings of Monte Carlo and path-based STA, uses progressive computation: statistical timing analysis is performed block by block in the forward direction in the circuit timing graph without looking back at the path history, by use of only an ADD operation and a MAX operation:

ADD: When an input edge delay X propagates through a node delay Y, the output edge delay will be $Z=X+Y$.

MAX: When two edge delays X and Y merge in a node, a new edge delay $Z=MAX(X,Y)$ will be formulated before the node delay is added.

Note that the MAX operation can also be modeled as a MIN operation, since $MIN(X,Y)=-MAX(-X,-Y)$. Thus, while a MIN operation can also be relevant in STA analysis, it is often simpler to use only one of the MAX and MIN operators. For sake of simplicity, throughout this document, the MAX operator will be used, with the understanding that the same results can be adapted to the MIN operator.

With the two operators ADD and MAX, the computational complexity of block based STA grows linearly (rather than exponentially) with respect to the circuit size, which generally results in manageable computations. The computations are further accelerated by assuming that all timing variables in a circuits follow the Gaussian (normal) distribution: since a linear combination of normally distributed variables is also normally distributed, the correlation relations between the delays along a circuit path are efficiently preserved.

However, it is common for high-end VLSI circuits to have level-sensitive latches and feedback loops—but most of the existing STA methods are not readily adaptable to accommodate analysis of circuits including these elements. When feedback loops are present, the latches—which are otherwise "transparent" in a timing sense (i.e., they do not affect timing)—may cause random timing variables to be self-dependent, in that the values of these variables in one iteration/cycle are dependent on their values in the prior iteration/cycle. STA methods for latch-based circuits have been proposed (see, e.g., M. C.-T. Chao, L.-C. Wang, K.-T. Cheng, and S. Kundu, "Static statistical timing analysis for latch-based pipeline designs," IEEE/ACM International Conference on Computer Aided Design, 2004. ICCAD-2004, pp. 468-472, November 2004), but these generally do not address the issue of self-dependence. Those that do address self-dependence generally bear disadvantages which make them computationally expensive; for example, in R. Chen and H. Zhou, "Clock schedule verification under process variations," IEEE/ACM International Conference on Computer Aided Design, ICCAD-2004, pp. 619-625, November 2004, graph sorting algorithms are proposed for dealing with feedback loops, but the computation complexity of these algorithms can grow exponentially with circuit size, thereby subjecting this methodology to many of the same disadvantages as for path-based STA.

Given that the trend in circuit fabrication is toward increased complexity with higher speed and lower size, there is clearly a pressing need for accurate methods of statistical timing analysis which compensate for issues raised by latches and feedback loops, and which are computationally efficient so that rapid design and testing is feasible.

SUMMARY OF THE INVENTION

The invention, which is defined by the claims set forth at the end of this document, is directed to methods of predicting performance criteria—most importantly, circuit timing yields and critical cycle means—in circuits which contain latches and feedback loops. To briefly review, Section 1 of the Detailed Description section reviews the clock scheme and basic terminology upon which the invention is based. Section 2 of the Detailed Description then discusses iterative calculation of the circuit timing yield. Section 3 of the Detailed Description then discusses iterative calculation of the critical cycle means (the largest cycle mean among all loops in the circuit). It should be understood that each of the circuit timing yield and the critical cycle means can be calculated alone for use in evaluating circuit performance, or these quantities can be calculated together (either concurrently, or with one of these quantities being calculated before the other). Section 4 of the Detailed Description then discusses experimental results for the invention, and shows that the methods of the invention which are used to calculate circuit timing yield and the critical cycle means compare very favorably to Monte Carlo calculation/prediction methods.

The invention is preferably implemented as part of a circuit design program, or as a standalone application for analysis of circuit designs, whereby the circuit timing yield and/pr the critical cycle means can be determined for a proposed circuit design. The circuit design can then be revised in response to the calculated circuit timing yield and/or critical cycle means to better attain desired performance standards.

Further advantages, features, and objects of the invention will be apparent from the following detailed description of the invention in conjunction with the associated drawings.

BRIEF SUMMARY OF NOTATION

Following is a brief summary of selected notation/symbology used throughout this document:
N total number of latches in the circuit
$T_c$ clock cycle time
$T_i^h$ clock high time at latch i
$H_i$ hold time of latch i
$S_i$ setup time of latch i
$C_i$ rising clock edge arrival time at $i^{th}$ latch
$\delta_{ij}$ minimum combinational delay from latch i to j
$\Delta_{ij}$ maximum combinational delay from latch i to j
$a_i$ earliest signal arrival time at $i^{th}$ latch
$A_i$ latest signal arrival time at $i^{th}$ latch
$d_i$ earliest signal departure time at $i^{th}$ latch
$D_i$ latest signal departure time at $i^{th}$ latch
Y circuit timing yield
$s_i$ setup time violation at $i^{th}$ latch
$h_i$ hold time violation at $i^{th}$ latch
$s_c$ critical setup time violation of the circuit
$h_c$ critical hold time violation of the circuit
$P_m$ number of latches in the feedback loop m
$G_m$ cycle mean of the feedback loop m
$G_c$ critical cycle mean of the circuit
k iteration index (iteration number)
$O_i^k$ iteration mean of latch i at $k^{th}$ iteration
$O_c^k$ critical iteration mean for the circuit at $k^{th}$ iteration
$P_i^k$ cumulative delay for latch i at $k^{th}$ iteration
$O_i^k$ iteration mean for latch i at $k^{th}$ iteration
$O_c^k$ iteration mean for latch i at $k^{th}$ iteration
$\sigma_O^k$ standard deviation of the critical iteration mean at $k^{th}$ iteration
$\mu_O^k$ average (mean) critical iteration mean at $k^{th}$ iteration It should be understood that this notation is merely exemplary, and the methodology of the invention can be implemented in machine-readable instructions (e.g., in computer programming language) with use of other and/or additional notation.

DETAILED DESCRIPTION OF PREFERRED VERSIONS OF THE INVENTION

1. Problem Formulation

Initially, for sake of simplicity, this document will generally discuss the case where all latches are clocked under the same frequency 1/T. However, it should be understood that the methods described in this paper can be extended to the case of multiple clock frequencies by partitioning a circuit into different clock domains and analyzing each domain individually.

If level-sensitive latches are sequentially arranged in a circuit, iterative methods are preferably used for analysis of circuit timing problems due to the possible self-dependence issue, with one iteration being performed at every clock cycle. During each iteration k (k being used to denote the iteration index), signal departure times at all latches' outputs are computed, and signal arrival times at all latches' inputs are updated.

Figure 1:
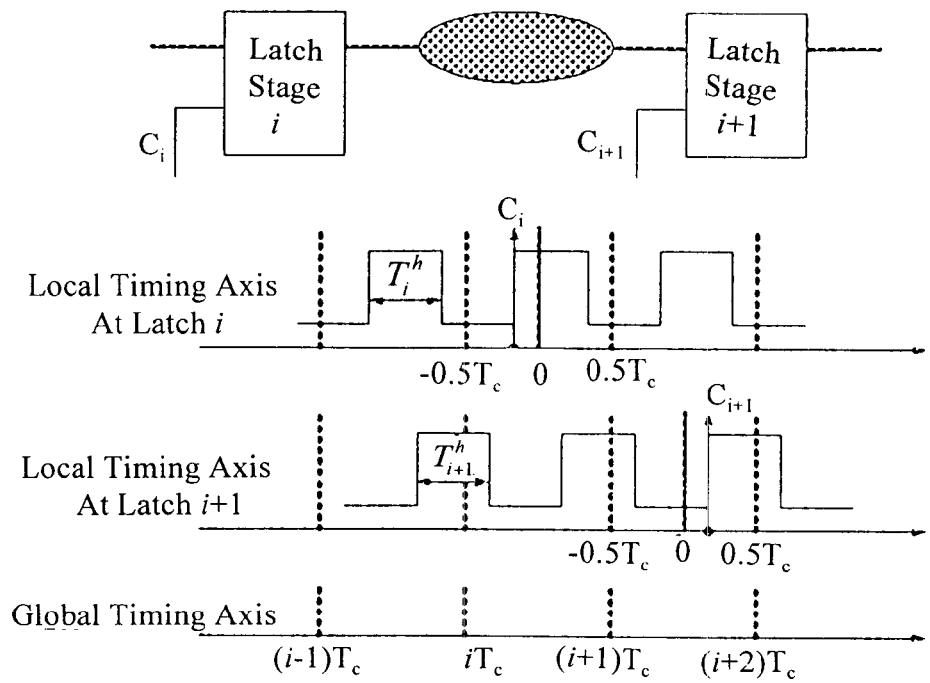
FIG. 1 illustrates the clock scheme applied to two latches i and i+1 in an exemplary circuit, the timing analysis global time axis applicable to all latches, and the timing analysis local time axis applied to each latch individually.

Referring to FIG. 1, which illustrates the clock scheme in an exemplary circuit, the latches in the circuit (here specifically labeled latch i and latch i+1) share a global time axis for timing analysis. Additionally, each latch j (j being used to generically refer to any of the latches) has a local time axis which is always zeroed at the center of the time range to which the latch belongs. The latch clocking signals are not assumed to be synchronous. Instead, each latch j might have a different rising clock edge arrival time $C_j$ expressed along the local time axis. Also, the clock's duty cycle $T_j^h$ can be arbitrary, with the high and low time of the clock at latch j being denoted as $T_j^h$ and $T_c-T_j^h$ respectively (with $T_c$ indicating the clock cycle time). The signal/data transmission within one latch stage is presumed to take exactly one clock cycle time $T_c$. Consecutive latches are timed at the consecutive time ranges in the global time axis. Since all clock edge arrival times $C_j$ are expressed along the local time axis, there will then be constraints for these clock edge arrival times $C_j$ due to the assumption that there is one clock cycle time $T_c$ per latch stage:

$$-0.5T_c \leq C_j \leq 0.5T_c (j=1,2,\ldots,N)$$

In the following discussion, all latches are also presumed to be active during the high time of the clock, though the invention is readily extendable into the case of active low latches (or the case where latches are mixed active-high and active-low) since there are no constraints for the clock edge arrival times $C_j$ at the latches.

Figure 2:
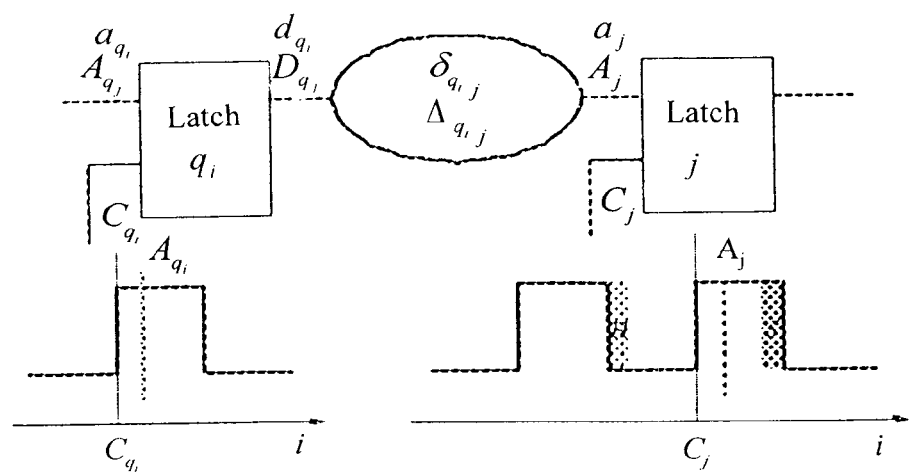
FIG. 2 provides a latch timing diagram for a latch j and one of its input latches $q_i$ that has combinational output paths to latch j.

FIG. 2 shows a latch j and one of its input latches $q_i$ that has combinational output paths to latch j. The signal departure time of latch $q_i$ at the kth iteration will be:

$$d_{qi}^k = \max(a_{qi}^k, C_{qi}) - T_c \quad (1)$$

$$D_{qi}^k = \max(A_{qi}^k, C_{qi}) - T_c \quad (2)$$

On the other hand, the signal arrival time of latch j for the next iteration k+1 will be decided by all of its input latches $q_1$, $q_2$, ... as:

$$a_k^{k+1} = \min_{(i=1,2,\ldots)} (d_{qi}^k + \delta_{qij}) \quad (3)$$

$$A_j^{k+1} = \max_{i=1,2\ldots} (D_{qi}^k, \Delta_{qij}) \quad (4)$$

Iterations will start from an initial state of index k=0 where all latches have latest signal arrival time of $-\infty$ and earliest signal arrival time of $+\infty$:

$$a_j^0 = +\infty \text{ and } A_j^0 = -\infty (j=1,2,\ldots,N) \quad (5)$$

For sake of simplicity, this document will assume that the signal departure times at the primary inputs of the circuit will always be 0 at every iteration. (This condition is not mandatory, and any values or distributions can be applied as the departure times at the primary inputs.)

Owing to process variations (i.e., factors which cause timing variations, as discussed at the outset of this document), all latches' setup and hold times $S_j$ and $H_j$, as well as all combinational delays between latches, $\delta_{ij}$ and $\Delta_{ij}$ are random variables. The clock cycle time $T_c$ is presumed to be a given deterministic value, but since the clock distribution network will be affected by process variations, all clock edge arrival times $C_j$ and duty cycles $T_j^h$ are presumed to be random variables. All of these time variables $S_j$, $H_j$, $\delta_{ij}$, $\Delta_{ij}$, $C_j$, and $T_j^h$—which will be referred to as input timing variables—can be expressed as a linear combination of Gaussian random variables, as by expressing them in the well-known canonical format (see, e.g., C. Visweswariah, K. Ravindran, and K. Kalafala, "First-order parameterized block-based statistical timing analysis," TAU'04, February 2004; A. Agarwal, D. Blaauw, and V. Zolotov, "Statistical timing analysis for intra-die process variations with spatial correlations," Computer Aided Design, 2003 International Conference on. ICCAD-2003, pp. 900-907, November 2003; H. Chang and S. S. Sapatnekar, "Statistical timing analysis considering spatial correlations using a single pert-like traversal," ICCAD'03, pp. 621-625, November 2003). Preferably, the input timing variables are expressed in the Extended Pseudo-Canonical Timing (EPCT) format discussed in L. Zhang, W. Chen, Y. Hu, and C. C. Chen, "Statistical timing analysis with extended pseudo-canonical timing model," DATE'05, March 2005 (with the entirety of this document being incorporated herein), and the remainder of this document will assume use of the EPCT format.

Since the values of process parameters (i.e., parameters relating to interconnect diameter, gate quality, etc.) will not change once the circuit is manufactured, process variations will be correlated from iteration to iteration. In other words, process variations are independent of the iterations. Further, since all input timing variables can be precomputed as a linear function of process variations (e.g., by expressing them in the canonical, EPCT, or other linear format noted above), they are also all independent of the iteration index k. The issue is then as follows: given all input timing variables (which are expressed in linear formats, e.g., in the EPCT format), how do we predict the timing yield for a latch-based sequential circuit, i.e., the probability that the circuit will meet its timing requirements, given the presence of process variations?

2. Iterative Yield Prediction

This section will describe an iterative process which may be used to predict the timing yield of a latch-based circuit under process variations.

For optimal operation of a sequential circuit, a circuit must satisfy setup time constraints and hold time constraints. Setup time constraints require that a signal should transfer from one register to the next fast enough so that it arrives at the second register at least one set-up time before the next clock edge. Hold time constraints require that the signal cannot travel too fast, so that the second register can latch the value correctly. Violation of either constraint results in a delay fault. To make latch j free from delay faults at iteration k, the setup and hold time constraints must be satisfied as:

$$h_j^k = a_j^k - (C_j - T_c + T_j^h + H_j) \geq 0 \quad (6)$$

$$s_j^k = A_j^k - (C_j + T_j^h - S_j) \geq 0 \quad (7)$$

where $s_j^k$ and $h_j^k$ are quantities referred to herein as setup and hold time violations of latch j at iteration k.

To make all latches in the circuit free from delay faults through the kth iteration, the setup and hold time constraints must be satisfied as:

$$s_c^k = \max_{(j=1,2,\ldots,N)} (s_j^0, s_j^1, \ldots, s_j^k) \leq 0 \quad (8)$$

$$h_c^k = \min_{(j=1,2,\ldots,N)} (h_j^0, h_j^1, \ldots, h_j^k) \geq 0 \quad (9)$$

where $s_c^k$ and $h_c^k$ are called critical setup and hold time violations until iteration k. Since the critical setup and hold time violations are both random variables, the probability of having the foregoing setup/hold time constraints satisfied will be the circuit timing yield until iteration k:

$$Y^k = Pr\{h_c^k \geq 0 \cap s_c^k \leq 0\} \quad (10)$$

If we cumulate the yield computed by equation (10) at every iteration, we will then get a sequence of yield iterations $Y^0$, $Y^1$, ....

The use of such a sequence to compute the circuit yield is only useful if it converges on some final value after sufficient iterations. It can be proven as follows that the yield iteration sequence $Y^0, Y^1, \ldots$ will always monotonically converge. From the expressions (8) and (9) for $s_c^k$ and $h_c^k$, it can be shown that $s_c^k$ will be a monotonically non-decreasing function of k, and $h_c^k$ will be a monotonically non-increasing function of k. Thus, the probability of having $s_c^k \leq 0 \cap h_c^k \geq 0$ will never increase, and the yield iteration sequence will always be monotonic. Since $Y^k$ is expressed as a probability, it is clear that $0 \leq Y^k \leq 1$ for all possible iterations k, and thus the iteration sequence is always bounded on the lower end by 0 and on the upper end by 1. Since a bounded monotonic sequence always converges, this confirms that the yield iteration sequence $Y_0, Y^1, \ldots$ always monotonically converges.

Thus, there must exist a converged value for the yield iteration sequence $Y_0, Y^1, \ldots$ after sufficient iterations. This value may be referred to as the overall circuit timing yield since it is the probability that all latches will satisfy the setup and hold time constraints at all iterations:

$$Y = Y^\infty = Pr\{h_c^\infty \geq 0 \cap s_c^\infty \leq 0\} \quad (11)$$

Given the foregoing, the following steps can be used to iteratively compute the circuit yield (with the predicted circuit yield being returned at exit):

```
1:   procedure Y = Yield (T_c,C_i,T_i^h,S_i,H_i,δ_ij,Δ_ij)
2:       for (each latch i) do                    ▷initialization
3:           a_i^0 = +∞; A_i^0 = -∞;
4:           d_i^0 = C_i - T_c; D_i^0 = C_i - T_c;
5:           S_c^∞ = -∞; h_c^∞ = +∞; Y^0 = 1;
6:       end for
7:       k = 0;
8:       repeat                                    ▷iteration starts
9:           k = k + 1
10:          for (each latch i) do                 ▷latch timing
11:              a_i^k = +∞; A_i^k = -∞;
12:              for (each latch j as i's immediate inputs) do
13:                  a_i^k = min (a_i^k, d_j^{k-1} + δ_ij) ;
14:                  A_i^k = max (A_i^k, D_j^{k-1} + Δ_ji) ;
15:              end for
16:              d_i^k = max (C_i, a_i^k) - T_c;
17:              D_i^k = max (C_i, A_i^k) - T_c;
18:              s_i^k = A_i^k - (C_i + T_i^h - S_i) ;
19:              h_i^k = a_i^k - (C_i - T_c + T_i^h + H_i) ;
20:              s_c^∞ = max(s_c^∞, s_i^k) ;
21:              h_c^∞ = min(h_c^∞, h_i^k) ;
22:          end for
23:          Y^k = Pr {s_c^∞ ≤ 0 ∩ h_c^∞ ≥ 0} ;
24:      until (|Y^k - Y^{k-1}| ≤ threshold)       ▷iteration ends
25:      Return Y^k;                               ▷return circuit yield
26:  End procedure
```

The foregoing methodology, termed "Yield," iteratively computes the circuit yield and returns the predicted yield at exit, which occurs when the change in the yield $Y^k$ is less than some value (denoted "threshold") between successive iterations. The only input timing variables needed are the clock scheme ($T_c, C_i, T_i^h$), the latches' setup and hold times ($S_i, H_i$), and the combinational circuit delays ($\delta_{ij}, \Delta_{ij}$), which can be computed using prior statistical timing analysis (STA) methods, e.g., those described in L. Zhang, W. Chen, Y. Hu, and C. C. Chen, "Statistical timing analysis with extended pseudo-canonical timing model," DATE'05, March 2005. All of these input timing variables (except the clock cycle time $T_c$) are preferably statistically computed and expressed as random variables, e.g., in the EPCT format of the foregoing Zhang et al. reference. Beneficially, the algorithm unconditionally converges for reasons discussed earlier.

3. Feedback Loops and Self-Dependence

Critical Cycle Mean

If a circuit includes both transparent latches and feedback loops, the timing variables may be dependent on their values in prior iterations. Because of this self-dependence issue, there will be either a lower bound for the cycle time of the circuit's clock to achieve a given timing yield, or there will be an upper bound for the circuit's timing yield given the clock cycle time. To address this self-dependence issue, a statistical parameter which will be referred to as the critical cycle mean (CCM) can be computed, and this parameter can be used to predict optimal clock cycle times.

Figure 3:
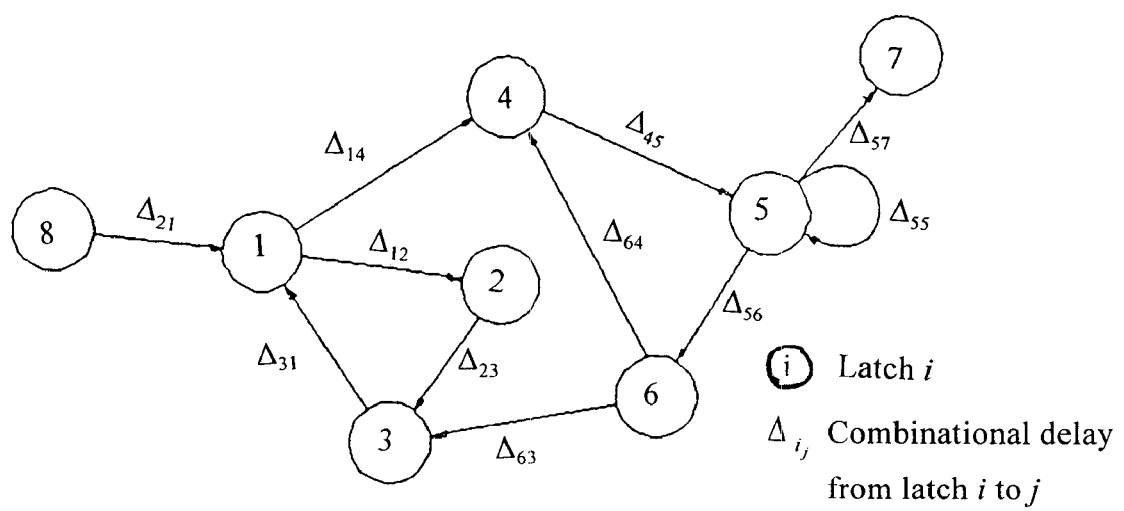
FIG. 3 is an exemplary "reduced" timing graph (directed acyclic graph) of a circuit with 8 latches, wherein the latches are modeled by nodes $n_1$ and combinational sub-circuits are modeled as directed edges $e_{ij}$.

Initially, the circuit in question can be partitioned into two parts, one containing latches and the other containing combinational sub-circuits. A "reduced" timing graph {V,E} can then be constructed wherein the latches are modeled by nodes $n_i(n_i \in V)$, and the combinational sub-circuits are modeled as directed edges, $e_{ij}(e_{ij} \in E)$, with the maximum combinational delay $\Delta_{ij}$ serving as a weight from node i to node j. All primary inputs will be considered as latches, and nodes are added into the reduced timing graph to represent them. A simple example of such a reduced timing graph is shown in FIG. 3, where a circuit with 8 latches is modeled.

Iterations on the reduced timing graph are done slightly differently than on the original circuit. Instead of propagating the arrival time from latch to latch, a new random variable of cumulative delay $P_j^k$ (cumulative delay P for latch j at iteration k) is propagated. The iteration starts from an initial state of $P_1^0 = P_2^0 = \ldots = P_1^0 = 0$ and:

$$P_j^{k+1} = \max_{(q1,q2,\ldots)}(P_{qi}^k + \Delta_{qi,j}) \quad (12)$$

where $q_1, q_2, \ldots$ are all input latch nodes for latch node j.

The main difficulty with iterative latch timing is the existence of loops in the reduced timing graph, which may possibly cause the timing variables to be self-dependent. Every loop m with $p_m$ latch nodes $q_1, q_2, \ldots q_{pm}$ in it will have a cycle mean ($G_m$), which is defined as the average edge weight in the loop at iteration k:

$$G_m = \frac{1}{p_m}(\Delta_{q1q2} + \Delta_{q2q3} + \ldots + \Delta_{qpmq1}) \quad (13)$$

and $p_m$ will be referred to as the cycle length. The cycle means of the loops in the reduced timing graph will be random variables, and will be independent of the iteration index k, since they are functions of the maximum combinational delays.

A reduced timing graph will often contain many loops, and among them, the loop with the greatest cycle mean is with the most important. Thus, we define the critical cycle mean (CCM) of the reduced timing graph, also referred to as $G_c$, as the largest cycle mean among all possible loops:

$$G_c = \max(G_1, G_2, \ldots) \quad (14)$$

The importance of the critical cycle mean is demonstrated by the following analysis. When a circuit is manufactured, all process parameters will assume deterministic values; thus, all circuit timing variables, including the critical cycle mean CCM, will become deterministic. Assume the critical cycle mean for a manufactured circuit is $g_c$, which is a deterministic value. In T. Szymanski and N. Shenoy, "Verifying clock schedules," IEEE/ACM International Conference on Computer-Aided Design, ICCAD-92, pp. 124-131 (1992) and N. Shenoy, R. Brayton, and A. Sangiovanni-Vincentelli, "Graph algorithms for clock schedule optimi," Computer-Aided Design (1992), it was shown that in the deterministic case, a feasible clock scheduling for such a manufactured circuit is possible only when $g_c \leq T$. If many circuits are manufactured, the cumulative histogram of all deterministic critical cycles for these manufactured circuits will match the distribution of the statistical critical cycle mean of $G_c$. The probability of $Pr\{G_c \leq T\}$ is then the probability for a manufactured circuit to have feasible clock scheduling. Thus, the timing yield value Ymax=Pr{Gc=T}. Or, stated formalistically, given the clock cycle time T, the maximum timing yield obtainable for a circuit whose reduced timing graph has a CCM of $G_c$ is:

$$Y_{max} = Pr\{G_c \leq T\} \quad (15)$$

The timing yield value $Y_{max} = Pr\{G_c \leq T_c\}$ can be interpreted as the upper bound of the circuit's timing yield given the clock cycle time of $T_c$. For a specific clock scheduling, this yield may not be reachable due to the possible hold time violations. On the other hand, the lower bound of the clock cycle timing to achieve a given timing yield of Y will be the Y quantile of the distribution of $G_c$.

In deterministic cases, efficient methods for computing the CCM are available; see, e.g., R. M. Karp, "A characterization of the minimum cycle mean in a digraph," Discrete Mathematics, vol. 23, pp. 309-311 (1978); S. M. Burns, "Performance analysis and optimization of asynchronous circuits," PhD Thesis, California Institute of Technology (1991). However, owing to process variations, these methods are difficult to directly apply when $G_c$ is a random variable. Thus, it is preferred that $G_c$ be computed with an iterative method using a concept which will be referred to herein as the "iteration mean." At every iteration k, each latch node i in the reduced timing graph will have an iteration mean defined as the latch's average cumulative delay per iteration:

$$O_i^k = \frac{P_i^k}{k+1} \quad (16)$$

The maximum iteration mean among all latches at iteration k is then called the critical iteration mean (CIM) for the circuit at iteration k:

$$O_c^k = \max(O_1^k, O_2^k, \ldots, O_N^k) \quad (17)$$

At every iteration k, the critical iteration mean will be a random variable since the arrival time at each iteration and each latch is a random variable. So mathematically, the critical iteration mean as defined in equation (17) will actually define a random process. It can be shown that the random process of the critical iteration mean, $O_c^k$, will stabilize after a sufficient number of iterations and will converge at the distribution of the critical cycle mean $G_c$:

$$G_c = O_c^\infty = \lim_{k \to \infty} O_c^k \quad (18)$$

This is so because for a manufactured circuit, the process parameters will take deterministic values, and thus the foregoing cumulative delay iterations for the manufactured circuit will give a deterministic sequence of critical iteration means $o_c^k$. In this deterministic case, the iteration will always converge into a deterministic critical cycle mean $g_c$ as shown in A. Dasdan and R. K. Gupta, "Faster maximum and minimum mean cycle algorithms for system-performance analysis," IEEE Transactions on Computer-Aided Design of Integrated Circuits and Systems, vol. 17, no. 10, pp. 889-899 (October 1998):

$$\lim_{k \to \infty} o_c^k = g_c$$

This occurs since the arrival time iteration $o_c^k$ for every manufactured circuit will actually be a realization of the random process of the critical iteration mean. Since every realization of the random process will converge into one specific value $g_c$ of the statistical critical cycle mean of $G_c$, the overall random process will then be stationary after sufficient iterations and will converge at distribution into the critical cycle mean $G_c$:

$$O_c^\infty = G_c$$

Given the foregoing, the following steps can be used to iteratively compute the critical cycle mean (with the critical cycle mean being returned at exit):

```
1:   procedure Gc = Loop(Δ_ij)
2:       for (each latch i) do                    ▷initialization
3:           P_i^0 = 0 ;
4:       end for
5:       k = 0; μ_O^0 = 0; σ_O^0 = 0
6:       repeat                                   ▷iteration starts
7:           k = k + 1;
8:           O_c^k = -∞ ;
9:           for (each latch i) do                ▷cumulative delays
10:              P_i^k = -∞ ;
11:              for (each latch j as i's immediate input) do
12:                  P_i^k = max(P_i^k, P_j^{k-1} + Δ_ji) ;
13:              end for
14:              O_c^k = max(O_c^k, P_i^k/(K+1));
15:              μ_O^k = mean(O_c^k); σ_O^k = std(O_c^k);
16:          end for
17:          error = max (|μ_O^k - μ_O^{k-1}|, |σ_O^k - σ_O^{k-1}|) ;
18:      until error ≤ threshold                  ▷iteration ends
19:      return O_c^k ;                           ▷return critical cycle mean
20:  end procedure
```

The foregoing methodology iteratively computes the critical iteration mean $O_c^k$, and thus the critical cycle mean $G_c$, which is taken to be the critical iteration mean $O_c^k$ when the error is less than some threshold value between successive iterations. The inputs for the method are the circuit maximum combinational delays, which again can be computed using prior statistical timing analysis (STA) methods, e.g., those described in L. Zhang, W. Chen, Y. Hu, and C. C. Chen, "Statistical timing analysis with extended pseudo-canonical timing model," DATE'05 (March 2005). For reasons discussed previously, the iterative method will converge unconditionally. Again, all input timing variables are preferably statistically computed and expressed as Gaussian random variables, e.g., in the EPCT format of the foregoing Zhang et al. reference. The convergence of the methodology can be confirmed by checking the convergence of mean and variance of the critical iteration mean $O_c^k$.

4. Simulations and Experimental Results

The foregoing methods for calculating the overall circuit timing yield Y and the critical cycle mean cycle mean $G_c$ have been implemented in the C/C++ programming language (with combinational delays computed using the STA methods of the Zhang et al. reference), and have been tested on ISCAS'89 benchmark circuits in comparison with the results of Monte Carlo simulations. (Monte Carlo analysis of latch-based circuits with feedback loops must necessarily be iterative as well, and here the Monte Carlo timing analysis utilized 10,000 repetitions.) Results of these comparative tests are illustrated in TABLE 1, wherein the quantity $\tau_{97}$, the 97% yield clock cycle, is the lower bound of the clock cycle time at which a given circuit will have a 97% timing yield. "StatITA" is used to denote the results of the statistical iterative timing analysis methods discussed above, whereas "MontITA" is used to denote the results of the iterative Monte Carlo simulations. It is seen that the results of the foregoing methods very closely match those provided by Monte Carlo methods, but provide greatly increased analysis speed (i.e., decreased CPU time for results calculation), with the methods returning results on the order of hundreds of times faster than Monte Carlo methods. Monte Carlo methods are usually regarded as the "gold standard" for simulation, but they bear the expense of long computational speeds—and these computational burdens increase for analysis of latch-based circuits with feedback loops owing to the need for numerous iterations to reach converged timing results. Thus, the value of analysis methods which have results closely corresponding to those of Monte Carlo methods, but with enhanced speed, should be evident.

TABLE 1

| Circuits | Gates | Latches | $\tau_{97}$ (ps) StatITA | MontITA | Error | CPU Time(s) StatITA | MontITA | Speedup |
|---|---|---|---|---|---|---|---|---|
| s298 | 130 | 14 | 443 | 452 | 2.0% | 2.14 | 320 | 150× |
| s526 | 196 | 21 | 465 | 469 | 0.9% | 5.76 | 694 | 120× |
| s641 | 173 | 19 | 999 | 998 | 0.1% | 1.17 | 372 | 320× |
| s820 | 279 | 5 | 777 | 788 | 1.4% | 1.35 | 692 | 513× |
| s953 | 401 | 29 | 862 | 858 | 0.5% | 3.32 | 1041 | 314× |
| s1423 | 616 | 74 | 2088 | 2051 | 1.8% | 16.0 | 2083 | 130× |
| s5378 | 1517 | 179 | 764 | 780 | 2.1% | 106 | 12372 | 117× |
| s9234 | 1827 | 211 | 859 | 858 | 0.1% | 101 | 19073 | 189× |
| s13207 | 3516 | 638 | 1242 | 1246 | 0.3% | 231 | 41571 | 180× |
| s15850 | 3889 | 534 | 1189 | 1199 | 0.8% | 540 | 61044 | 113× |
| s38417 | 11543 | 1636 | 1544 | — | — | 1468 | 200 hr* | 490× |
| s38584 | 12389 | 1426 | 1430 | — | — | 1209 | 303 hr* | 903× |
| Average | — | — | — | — | 1.1% | — | — | 303× |

The invention is not intended to be limited to the preferred methods and steps described above, but rather is intended to be limited only by the claims set out below. Thus, the invention encompasses all different versions that fall literally or equivalently within the scope of these claims. It should also be understood that in these claims, where symbols and formulae are expressed, the claims are not to be interpreted as meaning that the invention is limited to these symbols and formulae. Rather, the claims extend to processes utilizing the relations set forth by the formulae, regardless of whether the same characters/symbology are used, and regardless of whether the formulae are expressed in the form set forth in the claims or in a different format. In particular, the processes may be implemented in machine-readable code (e.g., in a computer program) wherein the steps of the processes are set forth using different terminology.

It should also be understood that in the claims, references to predicting timing yield in a circuit, and/or to performance of other steps in a circuit, encompasses portions of a circuit as well as an entire circuit. In other words, the circuit wherein the method is performed may in reality be a sub-circuit within a larger circuit. To illustrate, where a circuit has several different clocks running therein, the circuit may be partitioned into smaller circuits (each having its own clock), and the method may then be performed within each smaller circuit.

What is claimed is:

1. A method for predicting performance criteria in a circuit having latches and feedback loops, the method comprising the iterative repetition of the following steps in an electronic processor:
   a. for each latch i having one or more input latches j,
      (1) first calculating within the processor for each input latch j:
         (a) the earliest signal arrival time $a_i$ at latch i as the lesser of:
            (i) any previously defined value for the earliest signal arrival time $a_i$, and
            (ii) the sum of
               1) the earliest signal departure time $d_j$ at latch j in any prior iteration and
               2) the minimum combinational delay $\delta_{ji}$ from latch j to latch i;
         (b) the latest signal arrival time $A_i$ at latch i as the greater of:
            (i) any previously defined value for the latest signal arrival time $A_i$ and
            (ii) the sum of:
               1) the latest signal departure time $D_j$ at latch j in any prior iteration and
               2) the maximum combinational delay $\Delta_{ji}$ from latch j to latch i;
      (2) then calculating within the processor:
         (a) the setup time violation $s_i$ at latch i as the latest signal arrival time $A_i$:
            (i) minus the rising clock edge arrival time $C_i$,
            (ii) minus the clock high time $T_i^h$ at latch i, plus the setup time $S_i$ of latch i;
         (b) the hold time violation $h_i$ at latch i as the earliest signal arrival time $a_i$:
            (i) minus the rising clock edge arrival time $C_i$;
            (ii) minus the clock high time $T_i^h$ at latch i;
            (iii) minus the hold time $H_i$ of latch i;
            (iv) plus the clock cycle time $T_c$;
         (c) the critical setup time violation limit $s_c^\infty$ as the greater of:
            (i) any previously defined value for the critical setup time violation limit $s_c^\infty$, and
            (ii) the setup time violation $s_i$ at latch i;
         (d) the critical hold time violation limit $h_c^\infty$ as the lesser of:
            (i) any previously defined value for the critical hold time violation limit $h_c^\infty$, and
            (ii) the hold time violation $h_i$ at latch i;
   b. calculating the circuit timing yield Y within the processor as the probability that both
      (1) the critical setup time violation limit $s_c^\infty$ being less than or equal to zero, and
      (2) the critical hold time violation limit $h_c^\infty$ being greater than or equal to zero.

2. The method of claim 1 further comprising the step of ceasing repetition when successive calculations of the circuit timing yield Y change by less than a threshold value.

3. The method of claim 1 further comprising the step of calculating, during each iteration and for each latch i, the earliest signal departure time $d_i$ at latch i as the greater of
   a. the rising clock edge arrival time $C_i$ at latch i, and
   b. the earliest signal arrival time $a_i$ at latch i,
   minus the clock cycle time.

4. The method of claim 1 further comprising the step of calculating, during each iteration and for each latch i, the latest signal departure time $D_i$ at latch i as the greater of
   a. the rising clock edge arrival time $C_i$ at latch i, and
   b. the latest signal arrival time $A_i$ at latch i,
   minus the clock cycle time.

5. The method of claim 1 further comprising the steps of:
   a. providing a circuit model representing a proposed circuit design;
   b. calculating the circuit timing yield Y for the circuit model; and
   c. revising the circuit model in response to the calculated circuit timing yield Y.

* * * * *